(12) United States Patent
Matsunaga et al.

(10) Patent No.: US 10,305,056 B2
(45) Date of Patent: May 28, 2019

(54) ORGANIC ELECTROLUMINESCENT ELEMENT AND ORGANIC ELECTROLUMINESCENT PANEL

(71) Applicant: Sharp Kabushiki Kaisha, Sakai, Osaka (JP)

(72) Inventors: Kazuki Matsunaga, Sakai (JP); Katsuhiro Kikuchi, Sakai (JP); Hideki Uchida, Sakai (JP); Masanori Ohara, Sakai (JP); Satoshi Inoue, Sakai (JP); Eiji Koike, Sakai (JP); Yuto Tsukamoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 53 days.

(21) Appl. No.: 15/545,809

(22) PCT Filed: Jan. 19, 2016

(86) PCT No.: PCT/JP2016/051345
§ 371 (c)(1),
(2) Date: Jul. 24, 2017

(87) PCT Pub. No.: WO2016/121561
PCT Pub. Date: Aug. 4, 2016

(65) Prior Publication Data
US 2018/0019424 A1    Jan. 18, 2018

(30) Foreign Application Priority Data

Jan. 26, 2015 (JP) ................. 2015-012563

(51) Int. Cl.
*H01L 51/50* (2006.01)
*H05B 33/12* (2006.01)
*H01L 51/00* (2006.01)

(52) U.S. Cl.
CPC .......... *H01L 51/50* (2013.01); *H01L 51/5044* (2013.01); *H05B 33/12* (2013.01); *H01L 51/008* (2013.01)

(58) Field of Classification Search
CPC ............. H01L 51/5076; H01L 51/5068; H01L 51/5084; H01L 51/5092; H01L 51/5096; H01L 51/502; H01L 51/5024
See application file for complete search history.

(56) References Cited

U.S. PATENT DOCUMENTS 9,184,405 B2 * 11/2015 Song .................. H01L 51/5004
2005/0100760 A1   5/2005 Yokoyama et al.
(Continued)

FOREIGN PATENT DOCUMENTS

JP    2006-040856 A    2/2006
JP    2007-287691 A    11/2007
(Continued)

*Primary Examiner* — William F Kraig
*Assistant Examiner* — Khatib A Rahman
(74) *Attorney, Agent, or Firm* — ScienBiziP, P.C.

(57) ABSTRACT

The present invention provides an organic EL element with high luminous efficacy and high productivity, and an organic EL panel including the organic EL element. The organic electroluminescent element includes, in the given order: an anode; a hole transport layer; a light-emitting unit; an electron transport layer; and a cathode, the light-emitting unit including a first luminescent dopant layer, a first blocking layer, a second luminescent dopant layer, and a mixed light-emitting layer in the given order, the mixed light-emitting layer containing a first luminescent host material and a first luminescent dopant material, the first luminescent dopant layer substantially consisting of a second luminescent dopant material, the second luminescent dopant layer (Continued)

substantially consisting of a third luminescent dopant material, the first blocking layer containing a second luminescent host material.

20 Claims, 3 Drawing Sheets

(56) References Cited

U.S. PATENT DOCUMENTS

| | | | |
|---|---|---|---|
| 2006/0011908 A1* | 1/2006 | Ohsawa | H01L 51/0085 257/40 |
| 2006/0040132 A1 | 2/2006 | Liao et al. | |
| 2007/0141394 A1* | 6/2007 | Cheng | C07F 15/0033 428/690 |
| 2007/0228938 A1 | 10/2007 | Hatwar et al. | |
| 2007/0241676 A1 | 10/2007 | Park et al. | |
| 2009/0079338 A1 | 3/2009 | Mori et al. | |
| 2010/0079066 A1* | 4/2010 | Nomura | C07D 401/10 313/504 |
| 2011/0272680 A1* | 11/2011 | Suda | C07D 209/86 257/40 |
| 2011/0309337 A1* | 12/2011 | Nishimura | C09K 11/06 257/40 |
| 2013/0069090 A1 | 3/2013 | Sawabe et al. | |
| 2013/0270529 A1* | 10/2013 | Yonekuta | H01L 51/0059 257/40 |
| 2014/0217393 A1* | 8/2014 | Kato | C07D 403/10 257/40 |
| 2014/0374713 A1* | 12/2014 | Cho | H01L 51/5004 257/40 |

FOREIGN PATENT DOCUMENTS

| | | |
|---|---|---|
| JP | 2008-511100 A | 4/2008 |
| JP | 2009-043684 A | 2/2009 |
| JP | 2009-532825 A | 9/2009 |
| JP | 2009-301858 A | 12/2009 |
| JP | 2011-228569 A | 11/2011 |
| JP | 2013-065428 A | 4/2013 |
| WO | 2007/111192 A1 | 10/2007 |

* cited by examiner

ORGANIC ELECTROLUMINESCENT ELEMENT AND ORGANIC ELECTROLUMINESCENT PANEL

TECHNICAL FIELD

The present invention relates to organic electroluminescent elements (hereinafter, also referred to as "organic EL elements") and organic electroluminescent panels (hereinafter, also referred to as "organic EL panels"). More specifically, the present invention relates to an organic EL element having a configuration suited to emission of multiple colors of light, and an organic EL panel including the above organic EL element.

BACKGROUND ART

Organic EL panels that include organic electroluminescent elements utilizing electroluminescence of organic materials have received attention. Organic EL elements emit light by recombining holes injected from the anode and electrons injected from the cathode within a light-emitting layer disposed between these electrodes. When used as display panels for thin-profile display devices, such organic EL panels are superior to liquid crystal display devices in terms of high contrast ratio and low power consumption, for example. Also, organic EL panels are expected to be applied to various fields including illumination devices in addition to display devices.

For use in the fields such as display devices, organic EL panels are required to emit various colors of light, and are strongly desired to have an organic EL element structure capable of emitting white light. Various organic EL element structures capable of emitting white light have been developed. For example, an element structure called tandem structure is known which drives organic EL elements stacked in the vertical direction with a single power source. Although common tandem structures include organic EL elements that emit the respective primary colors of light, a tandem structure is also known which includes a stack of organic EL elements that emit white light (for example, see Patent Literature 1).

Other known element structures include an element structure in which light-emitting layers for the respective colors are stacked adjacent to each other (for example, see Patent Literature 2) and an element structure which contains two or more luminescent dopant materials with different emission peak wavelengths in one light-emitting layer (for example, see Patent Literature 3).

CITATION LIST

Patent Literature

Patent Literature 1: JP 2008-511100 T
Patent Literature 2: JP 2009-532825 T
Patent Literature 3: JP 2011-228569 A

SUMMARY OF INVENTION

Technical Problem

Figure 5:
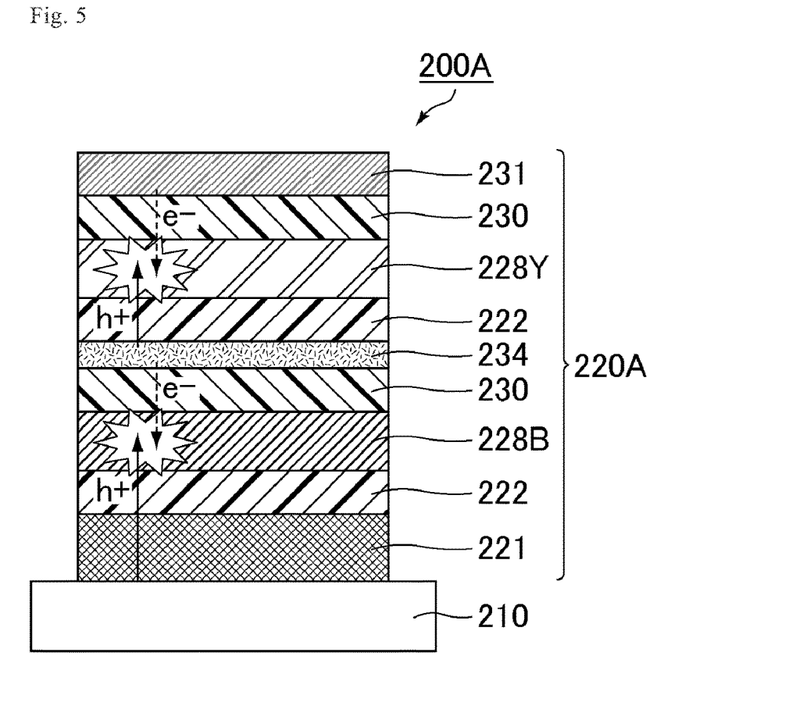
FIG. 5 is a schematic cross-sectional view of one example of an organic EL panel having a conventional tandem structure.

FIG. 5 is a schematic cross-sectional view illustrating one example of an organic EL panel having a conventional tandem structure. In an organic EL panel 200A illustrated in FIG. 5, an organic EL element 220A disposed on a substrate 210 has a structure in which an anode 221, a first hole injection layer 222, a blue light-emitting layer 228B, a first electron injection layer 230, a middle layer 234, a second hole injection layer 222, a yellow light-emitting layer 228Y, a second electron injection layer 230, and a cathode 231 are stacked in the given order from the substrate 210 side. A hole transport layer may be disposed between the first hole injection layer 222 and the blue light-emitting layer 228B and between the second hole injection layer 222 and the yellow light-emitting layer 228Y. An electron transport layer may be disposed between the blue light-emitting layer 228B and the first electron injection layer 230 and between the yellow light-emitting layer 228Y and the second electron injection layer 230.

In the organic EL element 220A having the tandem structure as described above, emission positions are completely vertically separated by the middle layer 234. This structure easily achieves a good carrier balance between electrons and holes, but involves difficulty in selecting an appropriate material for the middle layer 234 that delivers holes and electrons. This structure therefore has problems such as high drive voltage and a decrease in luminous efficacy due to carrier loss in the middle layer. This structure also has a problem of low productivity because the structure requires two to three times more layers than the later-described element structure illustrated in FIG. 6.

Figure 6:
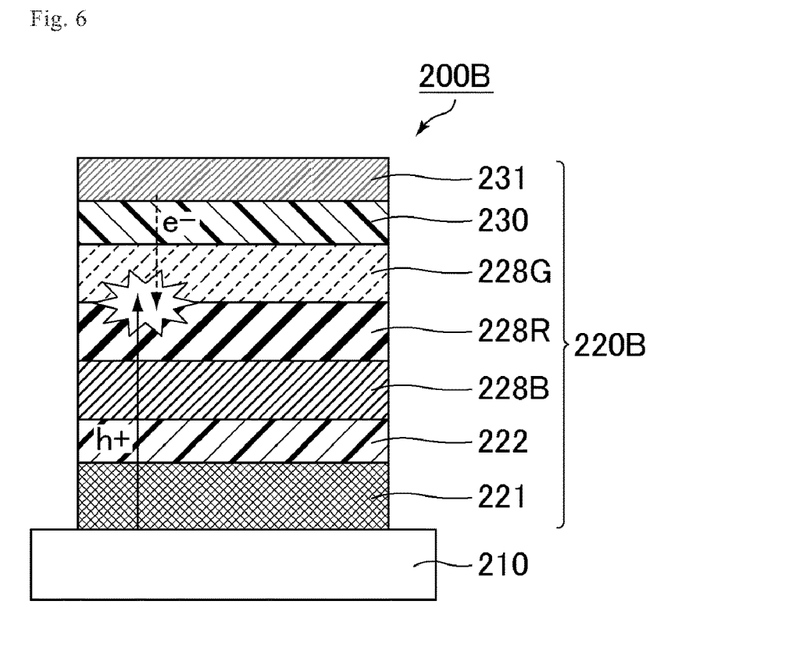
FIG. 6 is a schematic cross-sectional view of one example of an organic EL panel having a conventional structure including a stack of light-emitting layers for multiple colors.

FIG. 6 is a schematic cross-sectional view illustrating one example of an organic EL panel having a conventional structure including a stack of light-emitting layers for multiple colors. In an organic EL panel 200B illustrated in FIG. 6, an organic EL element 220B disposed on the substrate 210 has a structure in which the anode 221, the hole injection layer 222, the blue light-emitting layer 228B, a red light-emitting layer 228R, a green light-emitting layer 228G, the electron injection layer 230, and the cathode 231 are stacked in the given order from the substrate 210 side. A hole transport layer may be disposed between the hole injection layer 222 and the blue light-emitting layer 228B. An electron transport layer may be disposed between the green light-emitting layer 228G and the electron injection layer 230.

In the organic EL element 220B illustrated in FIG. 6, it is difficult to cause efficient light emission of the luminescent materials for the respective colors in all the three layers of the blue light-emitting layer 228B, the red light-emitting layer 228R, and the green light-emitting layer 228G by controlling the emission positions. This structure therefore has a problem of low luminous efficacy.

Meanwhile, the element structure which contains two or more luminescent dopant materials in one light-emitting layer also has a problem of a decrease in luminous efficacy because the structure requires co-deposition of multiple luminescent dopant materials, which is likely to cause mutual deactivation of the luminescent dopant materials.

The present invention has been made in view of such a current state of the art, and aims to provide an organic EL element with high luminous efficacy and high productivity, and an organic EL panel including the organic EL element.

Solution to Problem

The inventors have made various studies on methods for producing an organic EL element having a relatively simple structure and achieving high luminous efficacy. As a result, they have found that in a stack of a mixed light-emitting layer containing both a luminescent host material and a luminescent dopant material and two or more luminescent dopant layers substantially consisting of a luminescent dopant material with a blocking layer disposed between the two or more luminescent dopant layers, the configuration in a carrier recombination region is optimized, so that the luminous efficacy cam be improved. In particular, placing the blocking layer between the two or more luminescent dopant layers has been found to enable trapping of every single carrier in the corresponding luminescent dopant layer and prevention of contact between the luminescent dopant materials. Thereby, the inventors have conceived of a solution to the above problems, arriving at the present invention.

One aspect of the present invention may be an organic electroluminescent element including, in the given order: an anode; a hole transport layer; a light-emitting unit; an electron transport layer; and a cathode, the light-emitting unit including a first luminescent dopant layer, a first blocking layer, a second luminescent dopant layer, and a mixed light-emitting layer in the given order, the mixed light-emitting layer containing a first luminescent host material and a first luminescent dopant material, the first luminescent dopant layer substantially consisting of a second luminescent dopant material, the second luminescent dopant layer substantially consisting of a third luminescent dopant material, the first blocking layer containing a second luminescent host material.

Another aspect of the present invention may be an organic electroluminescent panel including: a substrate; and the organic electroluminescent element disposed on the substrate.

Advantageous Effects of Invention

The organic EL element of the present invention includes a stack of a mixed light-emitting layer containing both a luminescent host material and a luminescent dopant material and two or more luminescent dopant layers substantially consisting of a luminescent dopant material with a blocking layer disposed between the two or more luminescent dopant layers. The organic EL element therefore can reduce the chance of carrier barrier generation at interfaces between the layers compared with a configuration including a stack of multiple mixed light-emitting layers, thereby achieving efficient light emission of the luminescent dopant materials in the mixed light-emitting layer and the luminescent dopant layers. Also, placing the blocking layer between the two or more luminescent dopant layers enables trapping of every single carrier in the corresponding luminescent dopant layer and prevention of contact between the luminescent dopant materials, achieving nigh luminous efficacy.

The luminescent dopant layers can each be formed by, for example, short-time vapor deposition of a luminescent dopant material. Therefore, the organic EL element of the present invention has higher productivity than a conventional configuration including a stack of multiple mixed light-emitting layers.

The organic EL panel of the present invention includes the organic EL element that can achieve both high luminous efficacy and high productivity. The organic EL panel therefore cam give a product such as a display device or illumination device that has excellent productivity, low power consumption, and high luminance.

DESCRIPTION OF EMBODIMENTS

The organic electroluminescent as used herein is also referred to as "organic EL". An organic EL element is an element that is also typically called an organic light emitting diode (OLED).

Hereinafter, the present invention is described in more detail based on examples with reference to the drawings. The examples, however, are not intended to limit the scope of the present invention. The configurations of the examples may appropriately be combined or modified within the spirit of the present invention.

EXAMPLE 1

An organic EL panel of Example 1 includes an organic EL element including, in the given order from the substrate side, an anode, a hole injection layer, a hole transport layer, a light-emitting unit, an electron transport layer, an electron injection layer, and a cathode. The light-emitting unit has a structure in which a first luminescent dopant layer, a first blocking layer, a second luminescent dopant layer, a second blocking layer, and a mixed light-emitting layer are stacked in the given order from the hole transport layer side. Herein, the term used to refer to both of the first luminescent dopant layer and the second luminescent dopant layer is simply "luminescent dopant layers", and the term used to refer to both of the first blocking layer and the second blocking layer is simply "blocking layers". The term used to refer to both of electrons and holes is "carriers".

Figure 1:
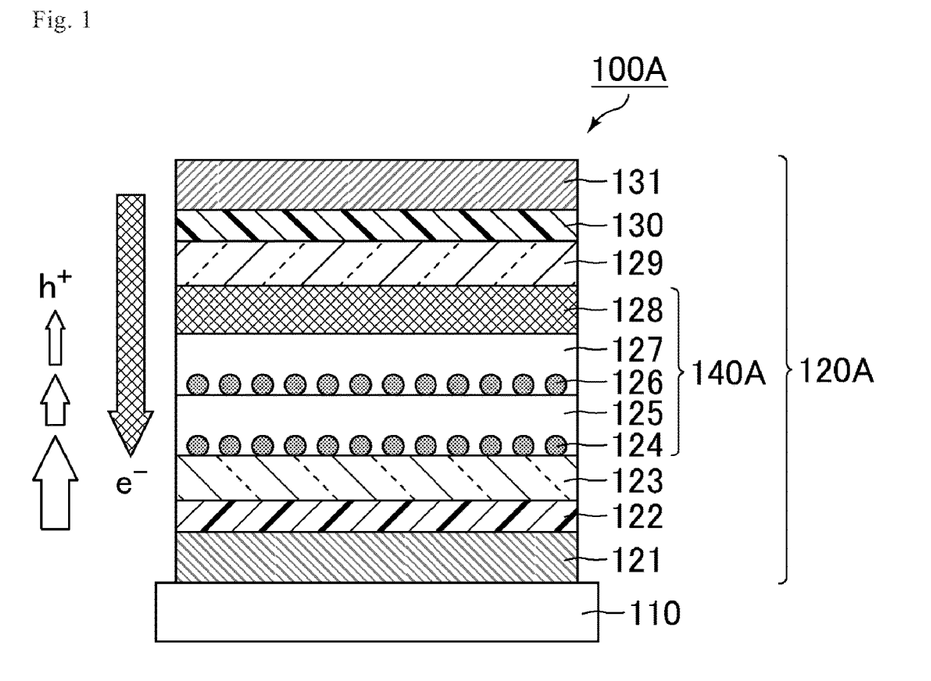
FIG. 1 is a schematic cross-sectional view of an organic EL element of Example 1.

FIG. 1 is a schematic cross-sectional view of an organic EL panel of Example 1. In an organic EL panel 100A illustrated in FIG. 1, an organic EL element 120A disposed on a substrate 110 has a structure in which an anode 121, a hole injection layer 122, a hole transport layer 123, a first luminescent dopant layer 124, a first blocking layer 125, a second luminescent dopant layer 126, a second blocking layer 127, a mixed light-emitting layer 128, an electron transport layer 129, an electron injection layer 130, and a cathode 131 are stacked in the given order from the substrate 110 side. The first luminescent dopant layer 124, the first blocking layer 125, the second luminescent dopant layer 126, the second blocking layer 127, and the mixed light-emitting layer 128 constitute a light-emitting unit 140A. In FIG. 1, the shaded arrow indicates the movement of electrons ($e^-$), and the white arrows indicate the movement of holes ($h^+$).

The substrate 110 can be a glass substrate or a plastic substrate, for example. Use of a bendable plastic substrate as the substrate 110 enables production of a flexible organic EL panel. Although not illustrated in FIG. 1, the substrate 110 is provided with thin-film transistors. The driving of the organic EL element 120A is controlled by the corresponding thin-film transistor that is electrically connected to the anode 121.

The material of the anode 121 used was indium tin oxide (ITO). The anode 121 had a thickness of 50 nm.

The material of the hole injection layer 122 used was dipyrazino[2,3-f:2',3'-h]quinoxaline-2, 3, 6, 7, 10, 11-hexacarbonitrile (HAT-CN). The material of the hole injection layer 122 can be the same hole injection material as that used in a common organic EL element. The hole injection layer 122 had a thickness of 10 nm.

The material of the hole transport layer 123 used was 4,4'-bis [N-(1-naphthyl)-N-phenyl-amino]-biphenyl (α-NPD). The material of the hole transport layer 123 can be the same hole transport material as that used in a common organic EL element. The hole transport layer 123 had a thickness of 20 nm.

The first luminescent dopant layer 124 substantially consists of a luminescent dopant material (second luminescent dopant material). That is, the concentration of the second luminescent dopant material in the first luminescent dopant layer 124 is 100 wt % or substantially 100 wt %. Here, the expression "the concentration of the luminescent dopant material in the luminescent dopant layer is substantially 100 wt %" means that the luminescent dopant layer contains no materials affecting the characteristics of the luminescent dopant layer in addition to the luminescent dopant material. The luminescent dopant layer may contain a trace of impurities as well as the luminescent dopant material, but preferably does not contain 3 wt % or more of the luminescent host material.

The second luminescent dopant material contained in the first luminescent dopant layer 124 can be a fluorescent dopant material or a phosphorescent dopant material. In Example 1, the second luminescent dopant material used was bis (3,5-difluoro-2-(2-pyridyl)phenyl-(2-carboxypyridyl)iridium) (III) (FIrpic). The first luminescent dopant layer 124 may contain single or multiple luminescent dopant materials, but preferably contains a single luminescent dopant material. The second luminescent dopant material had an energy gap (band gap) of 2.9 eV. The energy gap of each material can be determined by measuring the absorption spectrum of each material.

The first luminescent dopant layer 124 is island-shaped. That is, the hole transport layer 123 and the first blocking layer 125 are in direct contact with each other at some parts. The luminescent dopant layer can be formed into an island shape just by shortening the deposition time. Specifically, an ultrathin film having a maximum thickness of 1 nm or smaller resulting from deposition is island-shaped. The first luminescent dopant layer 124 had a thickness at the thickest part (maximum thickness) of 0.2 nm. The lower limit of the maximum thickness of the first luminescent dopant layer 124 is preferably 0.1 nm, while the upper limit thereof is preferably 1 nm, more preferably 0.5 nm.

The first luminescent dopant layer 124 can be formed by deposition of the second luminescent dopant material.

The first luminescent dopant layer 124 having a concentration of the second luminescent dopant material of 100 wt % or substantially 100 wt % and having an island shape can prevent (1) a decrease in luminous efficacy due to concentration quenching and (2) a decrease in luminous efficacy due to carrier transport inhibition and an increase in drive voltage.

The first blocking layer 125 contains a second luminescent host material. The second luminescent host material used was 2,9-dimethyl-4,7-diphenyl-1,10-phenanthroline (BCP) having electron transportability. The first blocking layer 125 may contain single or multiple luminescent host materials, but preferably contains a single luminescent host material.

The first blocking layer 125 had a thickness of 3 nm. The lower limit of the thickness of the first blocking layer 125 is preferably 1 nm, while the upper limit thereof is preferably 5 nm. The blocking layer with an increased thickness completely blocks hole transport, whereas the blocking layer formed as an ultrathin film can vary the hole transmittance depending on the thickness of the blocking layer. The first blocking layer 125 having a thickness in the range of 1 nm to 5 nm enables control of carrier distribution in each of the first luminescent dopant layer 124 and the second luminescent dopant layer 126 and efficient light emission of the luminescent dopant materials contained in the respective layers.

The second luminescent host material constituting the first blocking layer 125 preferably has a larger energy gap than the second luminescent dopant material contained in the first luminescent dopant layer 124 and the third luminescent dopant material contained in the second luminescent dopant layer 126. Thereby, energy transfer from the second luminescent dopant material and the third luminescent dopant material to the second luminescent host material can be prevented, so that a decrease in the luminous efficacy can be prevented. The second luminescent host material has a larger energy gap than the second luminescent dopant material and the third luminescent dopant material by 0.1 eV or more. The second luminescent host material had an energy gap; of 3.5 eV.

The first blocking layer 125 is disposed between the first luminescent dopant layer 124 and the later-described second luminescent dopant layer 126. Since a luminescent dopant layer substantially consists of a luminescent dopant material, in a structure without the first blocking layer 125 between the luminescent dopant layers, the luminescent dopant material contained in the first luminescent dopant layer 124 and the luminescent dopant material contained in he second luminescent dopant layer 126 may come into contact with each other to be deactivated.

The second luminescent dopant layer 126 substantially consists of a luminescent dopant material (third luminescent dopant material). That is, the concentration of the third luminescent dopant material in the second luminescent dopant layer 126 is 100 wt % or substantially 100 wt %.

The third luminescent dopant material contained in the second luminescent dopant layer 126 may be a fluorescent dopant material or a phosphorescent dopant material. In Example 1, the third luminescent dopant material used was tris(2-phenylpyridinato)iridium(III) [Ir(ppy)3]. The second luminescent dopant layer 126 may contain single or multiple luminescent dopant materials, but preferably contains a single luminescent dopant material. The third luminescent dopant material had an energy gap of 2.6 eV.

The third luminescent dopant material contained in the second luminescent dopant layer 126 may be of the same type as the second luminescent dopant material contained in the first luminescent dopant layer 124. Still, the third luminescent dopant material contained in the second luminescent dopant layer 126 and the second luminescent dopant material contained in the first luminescent dopant layer 124 are preferably of different types.

The second luminescent dopant layer 126 is island-shaped. That is, the first blocking layer 125 and the second blocking layer 127 are in direct contact with each other at some parts. The second luminescent dopant layer 126 had a thickness at the thickest part (maximum thickness) of 0.2 nm. The lower limit of the maximum thickness of the second luminescent dopant layer 126 is preferably 0.1 nm, while; the upper limit thereof is preferably 1 nm, more preferably 0.5 nm.

The second luminescent dopant layer 126 can be formed by deposition of the third luminescent dopant material.

The second blocking layer 127 contains a third luminescent host material. The third luminescent host material used was BCP having electron transportability. The second blocking layer 127 may contain single or multiple luminescent host materials, but preferably contains a single luminescent host material. The third luminescent host material may be the same as or different from the second luminescent host material.

The second blocking layer 127 had a thickness of 2 nm. The lower limit of the thickness of the second blocking layer 127 is preferably 1 nm, while the upper limit thereof is preferably 5 nm, more preferably 3 nm. The second blocking layer 127 having a thickness in the range of 1 nm to 5 nm can vary the hole transmittance, control the carrier distribution in each of the second luminescent dopant layer 126 and the mixed light-emitting layer 128, and achieve efficient light emission of the luminescent dopant materials contained in the respective layers.

The third luminescent host material constituting the second blocking layer 127 preferably has a larger energy gap than the third luminescent dopant material constituting the second luminescent dopant layer 126 and the first luminescent dopant material constituting the later-described mixed light-emitting layer 128. Thereby, energy-transfer from the third luminescent dopant material and the first luminescent dopant material to the third luminescent host material can be prevented, so that a decrease in the luminous efficacy can be prevented. The third luminescent host material has a larger energy gap than the third luminescent dopant material and the first luminescent dopant material by 0.1 eV or more. The third luminescent host material had an energy gap of 3.5 eV.

The mixed light-emitting layer 128 is a layer containing at least one luminescent host material (first luminescent host material) and at least one luminescent dopant material (first luminescent dopant material).

In Example 1, a mixed layer was used which contained 2,2',2"-(1,3,5-benzinetriyl)-tris(1-phenyl-1-H-benzimidazole) (TPBi) having electron transportability as the first luminescent host material and tris(1-phenylisoquinoline) iridium(III) [Ir(piq)3] as the first luminescent dopant material. The first luminescent host material and the first luminescent dopant material of the mixed light-emitting layer 128 respectively had energy gaps of 3.5 eV and 2.0 eV. The first luminescent host material may be the same as or different from the second luminescent host material and/or the third luminescent host material constituting the blocking layers. Also, all the luminescent host materials may be the same material.

The ratio by weight of the first luminescent host material to the first luminescent dopant material in the mixed light-emitting layer 128 was 0.9:0.1. The ratio by weight of the first luminescent host material to the first luminescent dopant material is preferably 0.99:0.01 to 0.7:0.3.

The first luminescent dopant material can be a fluorescent dopant material or a phosphorescent dopant material.

The mixed light-emitting layer 128 had a thickness of 15 nm. The lower limit of the thickness of the mixed light-emitting layer 128 is preferably 10 nm, while the upper limit thereof is preferably 40 nm, more preferably 30 nm.

The mixed light-emitting layer 128 can be formed by co-deposition of the first luminescent host material and the first luminescent dopant material.

The luminescent dopant materials contained in the first luminescent dopant layer 124, second luminescent dopant layer 126, and mixed light-emitting layer 128 are preferably selected such that the layers can emit different three primary colors of light, and can be in any combination. In Example 1, the first luminescent dopant layer 124 emits blue light, the second luminescent dopant layer 126 emits green light, and the mixed light-emitting layer 128 emits red light.

A third luminescent dopant layer and a third blocking layer may be disposed between the mixed light-emitting layer 128 and the second blocking layer 127. In the case of including a third luminescent dopant layer, the light-emitting unit can also emit different four colors of light using the mixed light-emitting layer 128 and the three luminescent dopant layers.

As indicated by the shaded arrow in FIG. 1, electrons move from the cathode 131 toward the anode 121 in Example 1. The electrons spread to the entire mixed light-emitting layer 128, and are highly dense on the hole injection layer 122 side of the mixed light-emitting layer 128. Provision of the first luminescent dopant layer 124 and the second luminescent dopant layer 126 in the region highly dense with electrons enables efficient light emission. Since the first blocking layer 125 and the second blocking layer 127 separate the mixed light-emitting layer 128, the second luminescent dopant layer 126, and the first luminescent dopant layer 124 in Example 1, carriers recombine in each layer to cause the first luminescent dopant layer 124, the second luminescent dopant layer 126, and the mixed light-emitting layer 128 to emit light.

The material of the electron transport layer 129 used was bathophenanthroline (Bphen). The material of the electron transport layer 129 can be the same electron transport material as that used in a common organic EL element. The electron transport layer 129 had a thickness of 30 nm.

The material of the electron injection layer 130 used was lithium fluoride (LiF). The material of the electron injection layer 130 can be the same electron injection material as that used in a common organic EL element. The electron injection layer 130 had a thickness of 1 nm.

The cathode 131 used was a layer containing Ag and magnesium (Mg). The content ratio by weight of Ag to Mg was 0.9:0.1. The material of the cathode 131 is preferably a light transmissive, conductive material. The material may be replaced by, for example, ITO or indium, zinc oxide (IZO). The cathode 131 had a thickness of 20 nm.

The organic EL element 120A may be a bottom emission or top emission element.

In the case that the organic EL element 120A is a top emission element, the organic EL element 120A preferably further includes a reflective electrode between the substrate 110 and the anode 121. The reflective electrode may be a light-reflective electrode such as a silver (Ag) layer, an aluminum (Al) layer, or an indium (In) layer. The reflective electrode can have a thickness of 100 nm, for example.

The cathode 131 is preferably made of a light transmissive, conductive material such as ITO or IZO. In the case that the organic EL element 120A is a top emission element, the organic EL element 120A emits light from the cathode 131 side.

In the present example, the light-emitting unit 140A has the following features.

The light-emitting unit 140A includes only one mixed light-emitting layer 128 that is formed by co-deposition of a luminescent host material and a luminescent dopant material, and includes the luminescent dopant layers (first luminescent dopant layer 124 and the second luminescent dopant layer 126) substantially consisting of a luminescent dopant material in place of a stack of multiple mixed light-emitting layers.

The light-emitting unit 140A includes the first blocking layer 125 between the first luminescent dopant layer 124 and the second luminescent dopant layer 126. The light-emitting unit 140A also includes the second blocking layer 127 between the second luminescent dopant layer 126 and the mixed light-emitting layer 128.

The first luminescent dopant layer 124 and the second luminescent dopant layer 126 are island-shaped ultrathin films.

The first blocking layer 125 and the second blocking layer 127 are ultrathin films.

The first blocking layer 125, the second blocking layer 127, and the mixed light-emitting layer 128 each contain an electron transportable host material.

In the light-emitting unit 140A of Example 1 having the above features, electrons spread in the entire light-emitting unit 140A, especially with high density in the region where the first luminescent dopant layer 124 and the second luminescent dopant layer 126 are disposed. Meanwhile, holes are prevented by the first blocking layer 125 and the second blocking layer 127 from being localized in any of the layers in the light-emitting unit 140A. The distribution of holes is controlled by the thicknesses of the first blocking layer 125 and the second blocking layer 127. The light-emitting unit 140A of Example 1 therefore can recombine carriers in each of the first luminescent dopant layer 124, the second luminescent dopant layer 126, and the mixed light-emitting layer 128, thereby providing an emission position for each color to efficiently emit three colors of light. Accordingly, a device can be produced which can provide white display with a simple structure with no multiple light-emitting layers or no middle layer between them.

EXAMPLE 2

Although Example 1 relates to the organic EL panel including the light-emitting unit in which the second blocking layer is disposed between the mixed light-emitting layer and the second luminescent dopant layer, the second blocking layer cam be eliminated. An organic EL panel of Example 2 has the same configuration as that of the organic EL panel of Example 1, except that the organic EL panel of Example 2 lacks the second blocking layer.

Figure 2:
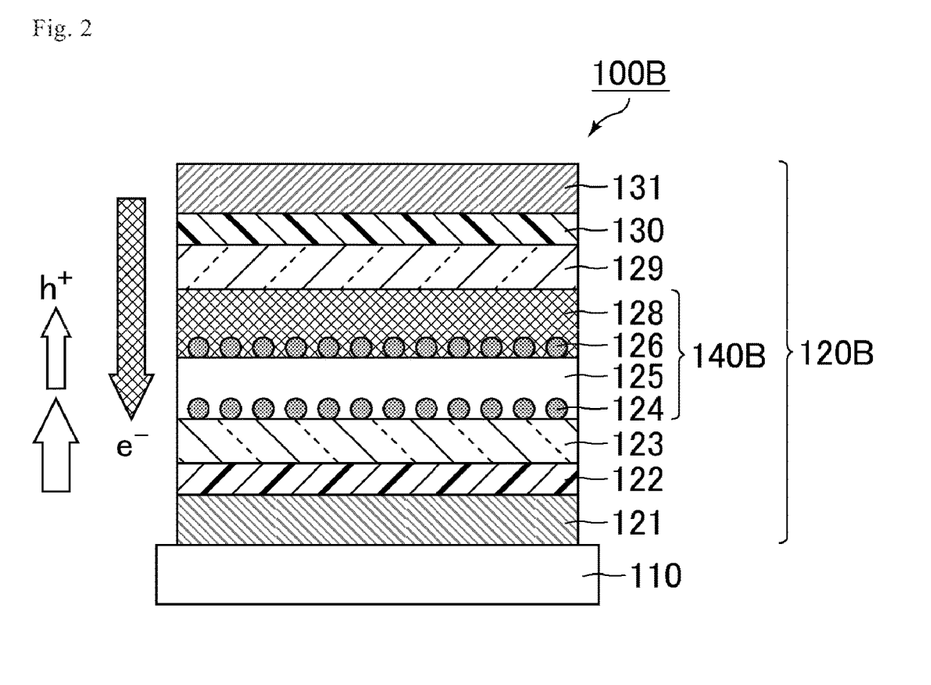
FIG. 2 is a schematic cross-sectional view of an organic EL element of Example 2.

FIG. 2 is a schematic cross-sectional view of an organic EL panel of Example 2. In an organic EL panel 100B illustrated in FIG. 2, an organic EL element 120B disposed on the substrate 110 has a structure in which the anode 121, the hole injection layer 122, the hole transport layer 123, the first luminescent dopant layer 124, the first blocking layer 125, the second luminescent dopant layer 126, the mixed light-emitting layer 128, the electron transport layer 129, the electron injection layer 130, and the cathode 131 are stacked in the given order from the substrate 110 side. The first luminescent dopant layer 124, the first blocking layer 125, the second luminescent dopant layer 126, and the mixed light-emitting layer 128 constitute a light-emitting unit 140B. In Example 2, the first luminescent dopant layer 124 emits blue light, the second luminescent dopant layer 126 emits red light, and the mixed light-emitting layer 128 emits green light. In Example 2, the second luminescent dopant layer 126 and the mixed light-emitting layer 128 are disposed adjacent to each other. In FIG. 2, the shaded arrow indicates the movement of electrons ($e^-$), and the white arrows indicate the movement of holes ($h^+$).

Even though the mixed light-emitting layer 128 and the second luminescent dopant layer 126 are in contact with each other, the probability of contact between the third luminescent dopant material contained in the second luminescent dopant layer 126 and the first luminescent dopant material contained in the mixed light-emitting layer 128 is not high unlike the case in which the luminescent dopant layers are in contact with each other. Hence, without the second blocking layer 127 between the second luminescent dopant layer 126 and the mixed light-emitting layer 128, the layers can emit light.

The first luminescent dopant material constituting the mixed light-emitting layer 128 has a larger energy gap than the third luminescent dopant material constituting the second luminescent dopant layer 126. This configuration causes energy transfer from the mixed light-emitting layer 128 to the second luminescent dopant layer 126 to achieve light emission by the luminescent dopant layer 126. The first luminescent dopant material preferably has a larger energy gap than the third luminescent dopant material by 0.1 eV or more.

According to the relationship between the emission wavelengths, the luminescent dopant material emitting blue light has the largest energy gap, the luminescent dopant material emitting green light has the second largest energy gap, and the luminescent dopant material emitting red light has the smallest energy gap. Based on this relationship, in the case of using the luminescent dopant material emitting green light as the first luminescent dopant material constituting the mixed light-emitting layer 128, the third luminescent dopant material constituting the adjacent second luminescent dopant layer 126 is preferably the luminescent dopant material emitting red light which has a smaller energy gap. This configuration causes partial transfer of energy excited in the mixed light-emitting layer 128 to the second luminescent dopant layer 126, achieving emission of green light and red light. If the mixed light-emitting layer 128 was made of the luminescent dopant material emitting red light and the second luminescent dopant layer 126 was made of the luminescent dopant material emitting green light, energy transfer from the mixed light-emitting layer 128 to the second luminescent dopant layer 126 would not occur and, even if the luminescent dopant material emitting green light was excited, energy transfer from the luminescent dopant material emitting green light to the luminescent dopant material emitting red light would occur, whereby green light emission could not be achieved.

In Example 2, the mixed light-emitting layer 128 contains TPBi having electron transportability as the first luminescent host material and contains Ir(ppy)3 as the first luminescent dopant material. The ratio by weight of the first luminescent host material to the first luminescent dopant material in the mixed light-emitting layer 128 was 0.9:0.1. The first luminescent host material had an energy gap of 3.5 eV, and the first luminescent dopant material had an energy gap of 2.6 eV, The mixed light-emitting layer 128 had a thickness of 20 nm.

In Example 2, the second luminescent dopant layer 126 contains Ir(piq)3 as the third luminescent dopant material. The third luminescent dopant material had an energy gap of 2.0 eV. The second luminescent dopant layer 126 had a thickness at the thickest part (maximum thickness) of 0.2 nm.

In Example 2, a device can be produced which can provide white display owing to efficient light emission of all the three luminescent dopant materials contained in the respective three layers as a result of recombination of carriers at the interface between the mixed light-emitting layer 128 and the second luminescent dopant layer 126 and in the first luminescent dopant layer 124.

EXAMPLE 3

Figure 3:
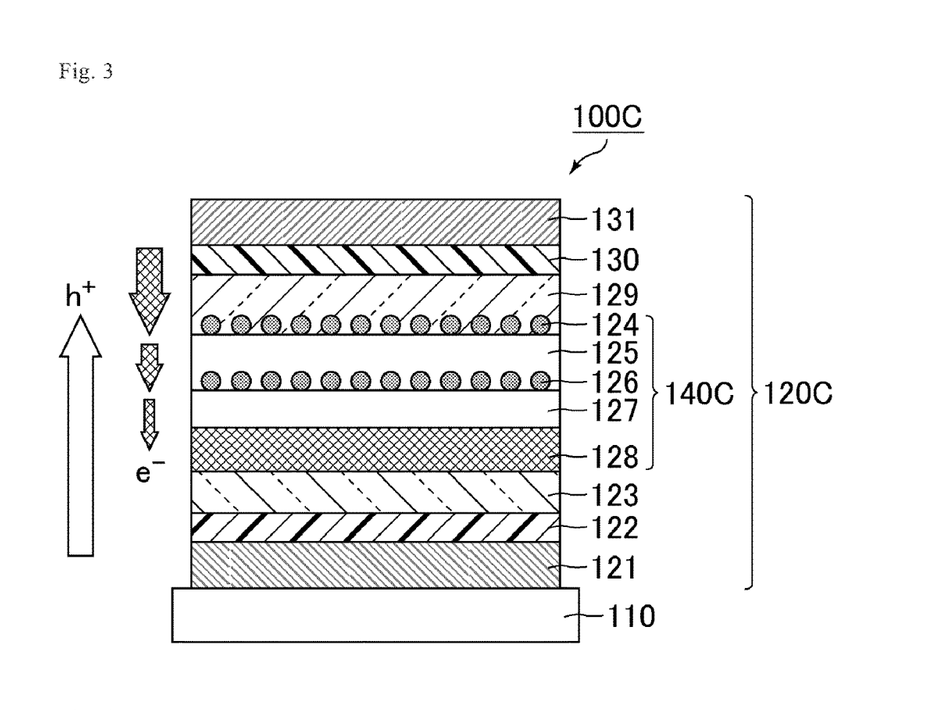
FIG. 3 is a schematic cross-sectional view of an organic EL element of Example 3.

Although the mixed light-emitting layer 128 was disposed on the electron transport layer 129 side of the organic EL element in Example 1, the mixed light-emitting layer 128 in the present invention may be disposed on the hole transport layer 123 side of the organic EL element. An organic EL panel of Example 3 has the same configuration as that of the organic EL panel of Example 1, except that the mixed light-emitting layer 128 is disposed at a different position and the luminescent host material has hole transportability.

FIG. 3 is a schematic cross-sectional view of an organic EL panel of Example 3. In an organic EL panel 100C illustrated in FIG. 3, an organic EL element 120C; disposed on the substrate 110 has a structure in which the anode 121, the hole injection layer 122, the hole transport layer 123, the mixed light-emitting layer 128, the second blocking layer 127, the second luminescent dopant layer 126, the first blocking layer 125, the first luminescent dopant layer 124, the electron transport layer 129, the electron injection layer 130, and the cathode 131 are stacked in the given order from the substrate 110 side. The mixed light-emitting layer 128, the second blocking layer 127, the second luminescent dopant layer 126, the first blocking layer 125, and the first luminescent dopant layer 124 constitute a light-emitting unit 140C. In Example 3, the mixed light-emitting layer 128 emits red light, the second luminescent dopant layer 126 emits green light, and the first luminescent dopant layer 124 emits blue light. In FIG. 3, the shaded arrow indicates the movement of electrons ($e^-$), and the white arrows indicate the movement of holes ($h^+$).

In Example 3, the mixed light-emitting layer 128 contains 4,4',4"-tris(carbazol-9-yl)-triphenylamine (TCTA) having hole transportability as the first luminescent host material. In the case that the mixed light-emitting layer 128 is disposed between the electron transport layer 129 and the second luminescent dopant layer 126 as in Example 1, i.e., in the case that the mixed light-emitting layer 128 is disposed on the electron transport layer 129 side of the organic EL element, the first luminescent host material contained in the mixed light-emitting layer 128 preferably has electron transportability. In contrast, in the case that the mixed light-emitting layer 128 is disposed between the hole transport layer 123 and the second luminescent dopant layer 126 as in Example 3, i.e., in the case that the mixed light-emitting layer 128 is disposed on the hole transport layer 123 side of the organic EL element, the first luminescent host material contained in the mixed light-emitting layer 128 preferably has hole transportability. Use of a luminescent host material having the same transportability as the adjacent carrier transport layer as the first luminescent host material in the mixed light-emitting layer 128 enables supply of carriers transported from the carrier transport layer to the entire light-emitting unit without inhibition.

In Example 3, the mixed light-emitting layer 128 contains TCTA having hole transportability as the first luminescent host material and contains Ir(piq)3 as the first luminescent dopant material. The ratio by weight of the first luminescent host material to the first luminescent dopant material in the mixed light-emitting layer 128 was 0.9:0.1. The first luminescent host material had an energy gap of 3.3 eV, and the first luminescent dopant material had an energy gap of 2.0 eV. The mixed light-emitting layer 128 had a thickness of 10 nm.

In Example 3, the second luminescent host material used in the first blocking layer 125 was 1,3-bis(N-carbazol-9-yl)benzene (mCP) having hole transportability. The second luminescent host material had an energy gap of 3.5 eV. The first blocking layer 125 had a thickness of 2 nm.

In Example 3, the third luminescent host material used in the second blocking layer 127 was polyvinylcarbazole (PVK) having hole transportability. The third luminescent host material had an energy gap of 3.6 eV. The second blocking layer 127 had a thickness of 2 nm.

In Example 3, the distribution of electrons can be controlled by adjusting the thicknesses of the first blocking layer 125 and the second blocking layer 127. The organic EL panel of Example 3 therefore can appropriately control carrier distribution and can recombine carriers in each of the first luminescent dopant layer 124, the second luminescent dopant layer 126, and the mixed light-emitting layer 128 as in Example 1. Accordingly, a device can be produced which can provide white display owing to efficient light emission of all the three luminescent dopant materials contained in the respective three layers.

Although the first luminescent host material was a material having electron transportability in Example 1 and was a material having hole transportability in Example 3, the first luminescent host material may be any material capable of supplying carriers to the entire light-emitting unit with its transportability. For example, the transport amount of carriers can be adjusted by using a bipolar host material or forming the mixed light-emitting layer 128 through co-deposition of a hole transportable host material and an electron transportable host material.

EXAMPLE 4

Although the luminescent host materials having electron transportability were used for the respective first blocking layer 125 and second blocking layer 127 in Example 1, a luminescent host material having hole transportability may be used. An organic EL panel of Example 4 has the same configuration as that of the organic EL panel of Example 1, except that the luminescent host materials for the respective first blocking layer 125 and second blocking layer 127 have hole transportability.

In Example 4, the second luminescent host material used in the first blocking layer 125 was TCTA having hole transportability. The second luminescent host material had an energy gap of 3.3 eV.

In Example 4, the third luminescent host material used in the second blocking layer 127 was m-CP having hole transportability. The third luminescent host material had an energy gap of 3.5 eV.

The luminescent host materials contained in the mixed light-emitting layer 128, the first blocking layer 125, and the second blocking layer 127 do not necessarily have the same carrier transportability, and may have different carrier transport abilities in the respective layers.

As in Example 1, a device can be produced which can provide white display in Example 4, owing to efficient light emission of all the three luminescent dopant materials contained in the respective three layers as a result of recombination of carriers in the first luminescent dopant layer 124, the second luminescent dopant layer 126, and the mixed light-emitting layer 128.

EXAMPLE 5

Figure 4:
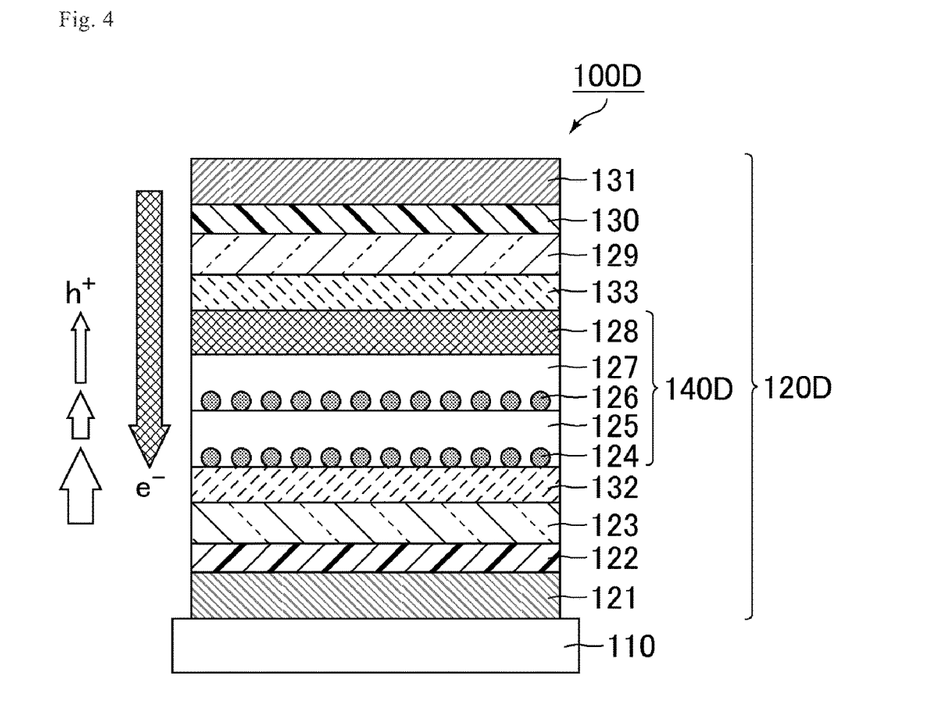
FIG. 4 is a schematic cross-sectional view of an organic EL element of Example 5.

An organic EL panel of Example 5 has the same configuration as the organic EL panel of Example 1, except that an electron-blocking layer having hole transportability is disposed between the hole transport layer 123 and the light-emitting unit, and a hole-blocking layer having electron transportability is disposed between the electron transport layer 129 and the light-emitting unit.

FIG. 4 is a schematic cross-sectional view of an organic EL panel of Example 5. In an organic EL panel 100D illustrated in FIG. 4, an organic EL element 120D disposed on the substrate 110 has a structure in which the anode 121, the hole injection layer 122, the hole transport layer 123, an electron-blocking layer 132, the first luminescent dopant layer 124, the first blocking layer 125, the second luminescent dopant layer 126, the second blocking layer 127, the mixed light-emitting layer 128, a hole-blocking layer 133, the electron transport layer 129, the electron injection layer 130, and the cathode 131 are stacked in the given order from the substrate 110 side. The first luminescent dopant layer 124, the first blocking layer 125, the second luminescent dopant layer 126, the second blocking layer 127, and the mixed light-emitting layer 128 constitute a light-emitting unit 140D. In FIG. 4, the shaded arrow indicates the movement of electrons ($e^-$), and the white arrows indicate the movement of holes ($h^+$).

The electron-blocking layer 132 has hole transportability. The electron-blocking layer 132 preferably contains a luminescent host material having hole transportability. The luminescent host material used in the electron-blocking layer 132 was TCTA having hole transportability. The electron-blocking layer 132 may contain single or multiple luminescent host materials, but preferably contains a single luminescent host material. The luminescent host material contained in the electron-blocking layer 132 may be the same as or different from the luminescent host material contained in the first blocking layer 125 and/or the second blocking layer 127.

The electron-blocking layer 132 had a thickness of 20 nm. The lower limit of the thickness of the electron-blocking layer 132 is preferably 10 nm, while the upper limit thereof is preferably 40 nm, more preferably 30 nm.

The electron-blocking layer 132 disposed between the hole transport layer 123 and the light-emitting unit 140D prevents entry of electrons moving from the cathode 131 to the anode 121 side into the hole transport layer 123, contributing to higher luminous efficacy.

The hole-blocking layer 133 has electron transportability. The hole-blocking layer 133 preferably contains a luminescent host material having electron transportability. The luminescent host material used in the hole-blocking layer 133 was tris(2, 4, 6-trimethyl-3-(pyridin-3-yl)phenyl)borane (3TPYMB) having electron transportability. The hole-blocking layer 133 may contain single or multiple luminescent host materials, but preferably contains a single luminescent host material. The luminescent host material contained in the hole-blocking layer 133 may be the same as or different from the luminescent host material contained in the first blocking layer 125 and/or the second blocking layer 127.

The hole-blocking layer 133 had a thickness of 20 nm. The lower limit of the thickness of the hole-blocking layer 133 is preferably 10 nm, while; the upper limit thereof is preferably 40 nm, more preferably 30 nm.

The hole-blocking layer 133 disposed between the electron transport layer 129 and the light-emitting unit 140D prevents entry of holes moving from the anode 121 to the cathode 131 side into the electron transport layer 129, contributing to higher luminous efficacy.

In Example 5, since a larger number of carriers can be trapped in the light-emitting unit 140D, a device can be produced which can provide white display owing to efficient light emission of all the three luminescent dopant materials contained in the respective three layers as a result of more efficient recombination of carriers in the first luminescent dopant layer 124, the second luminescent dopant layer 126, and the mixed light-emitting layer 128, Here, use of one of the electron-blocking layer 132 and the hole-blocking layer 133 alone can increase the luminous efficacy, and use of both of the layers can further increase the luminous efficacy.

The configuration in which the second blocking layer 127 is not provided as in Example 2 can be applied to the organic EL panels of Examples 3 to 5.

[Additional Remarks]

The technical features described in the examples of the present invention can be combined into a new embodiment of the present invention.

One aspect of the present invention may be an organic electroluminescent element including, in the given order: an anode; a hole transport layer; a light-emitting unit; an electron transport layer; and a cathode, the light-emitting unit including a first luminescent dopant layer, a first blocking layer, a second luminescent dopant layer, and a mixed light-emitting layer in the given order, the mixed light-emitting layer containing a first luminescent host material and a first luminescent dopant material, the first luminescent dopant layer substantially consisting of a second luminescent dopant material, the second luminescent dopant layer substantially consisting of a third luminescent dopant material, the first blocking layer containing a second luminescent host material. The organic EL element of this aspect can reduce the chance of carrier barrier generation at interfaces between the layers compared with a configuration including a stack of multiple mixed light-emitting layers, thereby achieving efficient light emission of the luminescent dopant materials in the mixed light-emitting layer and the luminescent dopant layers. Also, placing the first blocking layer between the first luminescent dopant layer and the second luminescent dopant layer enables trapping of every single carrier in the corresponding luminescent dopant layer and prevention of contact between the luminescent dopant materials, achieving high luminous efficacy.

In the above aspect, the first luminescent dopant layer and the second luminescent dopant layer may each have a thickness of 1 nm or smaller. Thereby, the luminescent dopant layers can each be formed into an island shape and carriers can spread in the entire light-emitting unit to achieve efficient light emission.

In the above aspect, the first blocking layer may have a thickness of 5 nm or smaller. Thereby, a sufficient carrier transmittance can be achieved in the first blocking layer, the distribution of carriers in the first luminescent dopant layer and the second luminescent dopant layer can be appropriate, and the luminescent dopant materials in both of the layers can emit light efficiently.

In the above aspect, the mixed light-emitting layer may be disposed between the electron transport layer and the second luminescent dopant layer, and the first luminescent host material may be electron transportable. Thereby, electrons transported from the electron transport layer can be supplied to the entire light-emitting unit without inhibition.

In the above aspect, the mixed light-emitting layer may be disposed between the hole transport layer and the second luminescent dopant layer, and the first luminescent host material may be hole transportable. Thereby, holes transported from the hole transport layer can be supplied to the entire light-emitting unit without inhibition.

In the above aspect, the light-emitting unit may further include a second blocking layer between the mixed light-emitting layer and the second luminescent dopant layer, and the second blocking layer may contain a third luminescent host material. Thereby, in the case that the mixed light-emitting layer is disposed on the electron transport layer side, every single carrier can be trapped in the corresponding second luminescent dopant layer and mixed light-emitting layer, so that higher luminous efficacy can be achieved.

In the above aspect, the second blocking layer may have a thickness of 5 nm or smaller. Thereby, a sufficient carrier transmittance can be achieved in the second blocking layer, the distribution of carriers in the mixed light-emitting layer and the second luminescent dopant layer can be appropriate, and the luminescent dopant materials in both of the layers cam emit light efficiently.

In the above aspect, the first luminescent dopant material may have a larger energy gap than the third luminescent dopant material. This configuration causes energy transfer from the mixed light-emitting layer to the second luminescent dopant layer to achieve light emission by the luminescent dopant layer.

In the above aspect, the organic electroluminescent element may further include an electron-blocking layer having hole transportability between the hole transport layer and the light-emitting unit. The electron-blocking layer can prevent entry of electrons into the hole transport layer, achieving even higher luminous efficacy.

In the above aspect, the organic electroluminescent element may further include a hole-blocking layer having electron transportability between the electron transport layer and the light-emitting unit. The hole-blocking layer can prevent entry of holes into the electron transport layer, achieving even higher luminous efficacy.

In the above aspect, the second luminescent host material may have a larger energy gap than the second luminescent dopant material and the third luminescent dopant material. Thereby, energy transfer from the second luminescent dopant material and the third luminescent dopant material to the second luminescent host material can be prevented, so that a decrease in the luminous efficacy can be prevented.

Another aspect of the present invention may be an organic electroluminescent panel including: a substrate; and the organic electroluminescent element disposed on the substrate.

REFERENCE SIGNS LIST 100A, 100B, 100C, 100D, 200A, 200B: organic EL panel
110, 210: substrate
120A, 120B, 120C, 120D, 220A, 220B: organic EL element
121, 221: anode
122, 222: hole injection layer
123: hole transport layer
124: first luminescent dopant layer
125: first blocking layer
126: second luminescent dopant layer
127: second blocking layer
128: mixed light-emitting layer
129: electron transport layer
130, 230: electron injection layer
131, 231: cathode
132: electron-blocking layer
133: hole-blocking layer
140A, 140B, 140C, 140D: light-emitting unit
228B: blue light-emitting layer
228G: green light-emitting layer
228R: red light-emitting layer
228Y: yellow light-emitting layer
234: middle layer

The invention claimed is:

1. An organic electroluminescent element comprising, in the given order:
   an anode;
   a hole transport layer;
   a light-emitting unit;
   an electron transport layer; and
   a cathode,
   the light-emitting unit including a first luminescent dopant layer, a first blocking layer, a second luminescent dopant layer, and a mixed light-emitting layer in the given order,
   the mixed light-emitting layer containing a first luminescent host material and a first luminescent dopant material,
   the first luminescent dopant layer substantially consisting of a second luminescent dopant material,
   the second luminescent dopant layer substantially consisting of a third luminescent dopant material,
   the first luminescent dopant layer and the second luminescent dopant layer each being island-shaped,
   the first blocking layer containing a second luminescent host material,
   wherein the light-emitting unit further includes a second blocking layer between the mixed light-emitting layer and the second luminescent dopant layer, and
   the second blocking layer contains a third luminescent host material.

2. The organic electroluminescent element according to claim 1,
   wherein the first luminescent dopant layer and the second luminescent dopant layer each have a thickness of 1 nm or smaller.

3. The organic electroluminescent element according to claim 1,
   wherein the first blocking layer has a thickness of 5 nm or smaller.

4. The organic electroluminescent element according to claim 1,
   wherein the mixed light-emitting layer is disposed between the electron transport layer and the second luminescent dopant layer, and
   the first luminescent host material is electron transportable.

5. The organic electroluminescent element according to claim 1,
   wherein the mixed light-emitting layer is disposed between the hole transport layer and the second luminescent dopant layer, and
   the first luminescent host material is hole transportable.

6. The organic electroluminescent element according to claim 1,
   wherein the second blocking layer has a thickness of 5 nm or smaller.

7. The organic electroluminescent element according to claim 1,
   wherein the first luminescent dopant material has a larger energy gap than the third luminescent dopant material.

8. The organic electroluminescent element according to claim 1, further comprising an electron-blocking layer having hole transportability between the hole transport layer and the light-emitting unit.

9. The organic electroluminescent element according to claim 1, further comprising a hole-blocking layer having electron transportability between the electron transport layer and the light-emitting unit.

10. The organic electroluminescent element according to claim 1,
wherein the second luminescent host material has a larger energy gap than the second luminescent dopant material and the third luminescent dopant material.

11. An organic electroluminescent panel comprising:
a substrate; and
the organic electroluminescent element according to claim 1 disposed on the substrate.

12. The organic electroluminescent element according to claim 1,
wherein the first luminescent dopant layer is formed in the interface between the hole transport layer and the first blocking layer, and
the hole transport layer and the first blocking layer are in direct contact with each other at some parts.

13. The organic electroluminescent element according to claim 1,
wherein the second luminescent dopant layer is formed in the interface between the first blocking layer and the second blocking layer, and
the first blocking layer and the second blocking layer are in direct contact with each other at some parts.

14. The organic electroluminescent element according to claim 1,
wherein the luminescent dopant material constituting the mixed light-emitting layer has a larger energy gap than the luminescent dopant material constituting the second luminescent dopant layer.

15. The organic electroluminescent element according to claim 14,
wherein the luminescent dopant material constituting the mixed light-emitting layer emits green light, and
the luminescent dopant material constituting the second luminescent dopant layer emits red light.

16. An organic electroluminescent element comprising, in the given order:
an anode;
a hole transport layer;
a light-emitting unit;
an electron transport layer; and
a cathode,
the light-emitting unit including a first luminescent dopant layer, a first blocking layer, a second luminescent dopant layer, and a mixed light-emitting layer in the given order,
the mixed light-emitting layer containing a first luminescent host material and a first luminescent dopant material,
the first luminescent dopant layer substantially consisting of a second luminescent dopant material,
the second luminescent dopant layer substantially consisting of a third luminescent dopant material,
the first luminescent dopant layer and the second luminescent dopant layer each being island-shaped,
the first blocking layer containing a second luminescent host material,
wherein the first luminescent dopant layer is formed in the interface between the hole transport layer and the first blocking layer, and
the hole transport layer and the first blocking layer are in direct contact with each other at some parts.

17. The organic electroluminescent element according to claim 16,
wherein the first luminescent dopant layer and the second luminescent dopant layer each have a thickness of 1 nm or smaller.

18. The organic electroluminescent element according to claim 16,
wherein the second luminescent dopant layer is formed in the interface between the first blocking layer and a second blocking layer, and
the first blocking layer and the second blocking layer are in direct contact with each other at some parts.

19. An organic electroluminescent element comprising, in the given order:
an anode;
a hole transport layer;
a light-emitting unit;
an electron transport layer; and
a cathode,
the light-emitting unit including a first luminescent dopant layer, a first blocking layer, a second luminescent dopant layer, and a mixed light-emitting layer in the given order,
the mixed light-emitting layer containing a first luminescent host material and a first luminescent dopant material,
the first luminescent dopant layer substantially consisting of a second luminescent dopant material,
the second luminescent dopant layer substantially consisting of a third luminescent dopant material,
the first luminescent dopant layer and the second luminescent dopant layer each being island-shaped,
the first blocking layer containing a second luminescent host material,
wherein the second luminescent dopant layer is formed in the interface between the first blocking layer and a second blocking layer, and
the first blocking layer and the second blocking layer are in direct contact with each other at some parts.

20. The organic electroluminescent element according to claim 19,
wherein the first luminescent dopant layer and the second luminescent dopant layer each have a thickness of 1 nm or smaller.

* * * * *